United States Patent
Toyao

(10) Patent No.: US 8,952,266 B2
(45) Date of Patent: Feb. 10, 2015

(54) STRUCTURAL BODY AND INTERCONNECT SUBSTRATE

(75) Inventor: Hiroshi Toyao, Tokyo (JP)

(73) Assignee: NEC Corporation, Tokyo (JP)

( * ) Notice: Subject to any disclaimer, the term of this patent is extended or adjusted under 35 U.S.C. 154(b) by 189 days.

(21) Appl. No.: 13/813,632

(22) PCT Filed: Aug. 26, 2011

(86) PCT No.: PCT/JP2011/004766
§ 371 (c)(1),
(2), (4) Date: Jan. 31, 2013

(87) PCT Pub. No.: WO2012/042740
PCT Pub. Date: Apr. 5, 2012

(65) Prior Publication Data
US 2013/0126225 A1 May 23, 2013

(30) Foreign Application Priority Data
Sep. 28, 2010 (JP) ................... 2010-217237

(51) Int. Cl.
*H05K 1/11* (2006.01)
*H05K 1/03* (2006.01)
(Continued)

(52) U.S. Cl.
CPC ............ *H05K 1/0296* (2013.01); *H05K 1/0236* (2013.01); *H01P 1/2005* (2013.01); *H01P 3/085* (2013.01); *H01Q 15/006* (2013.01); *H01Q 15/0086* (2013.01); *H05K 1/165* (2013.01); *H05K 2201/09263* (2013.01); *H05K 2201/09663* (2013.01); *H05K 2201/0969* (2013.01); *H05K 2201/09781* (2013.01); *H05K 2201/09972* (2013.01)

USPC ........... 174/262; 174/255; 174/257; 174/261; 333/12; 333/204; 361/794

(58) Field of Classification Search
USPC ............ 174/255, 257, 261, 262; 333/12, 204; 343/700 MS; 361/794
See application file for complete search history.

(56) References Cited

U.S. PATENT DOCUMENTS 6,476,771 B1 * 11/2002 McKinzie, III ............... 343/756
6,483,481 B1 * 11/2002 Sievenpiper et al. ......... 343/909
(Continued)

FOREIGN PATENT DOCUMENTS

| JP | 2006-246189 A | 9/2006 |
| JP | 2009-004791 A | 1/2009 |

(Continued)

*Primary Examiner* — Timothy Thompson
*Assistant Examiner* — Sherman Ng
(74) *Attorney, Agent, or Firm* — McGinn IP Law Group, PLLC

(57) ABSTRACT

A structural body includes: a first conductor and a second conductor of which at least portions are opposite to each other; a third conductor, interposed between the first conductor and the second conductor, of which at least a portion is opposite to the first conductor and the second conductor, and has a first opening; an interconnect provided in the inside of the first opening; and a conductor via which is electrically connected to the first conductor and the second conductor and is electrically insulated from the third conductor, wherein the interconnect is opposite to the first conductor and the second conductor, one end thereof being electrically connected to the third conductor at an edge of the first opening and an other end thereof being formed as an open end.

11 Claims, 24 Drawing Sheets

(51) Int. Cl.
*H05K 1/09* (2006.01)
*H04B 3/28* (2006.01)
*H01P 3/08* (2006.01)
*H05K 1/14* (2006.01)
*H05K 1/02* (2006.01)
*H01P 1/20* (2006.01)
*H01Q 15/00* (2006.01)
*H05K 1/16* (2006.01)

(56) References Cited

U.S. PATENT DOCUMENTS

| | | | |
|---|---|---|---|
| 7,737,899 B1 * | 6/2010 | McKinzie, III | 343/756 |
| 2005/0195051 A1 | 9/2005 | McKinzie | |
| 2007/0090901 A1 * | 4/2007 | Kanno et al. | 333/219 |
| 2007/0285188 A1 * | 12/2007 | Song et al. | 333/12 |
| 2008/0264685 A1 * | 10/2008 | Park et al. | 174/262 |
| 2008/0266018 A1 * | 10/2008 | Han et al. | 333/12 |
| 2008/0314630 A1 | 12/2008 | Kim et al. | |
| 2009/0085691 A1 | 4/2009 | Kim et al. | |
| 2009/0315648 A1 | 12/2009 | Toyao | |
| 2011/0179642 A1 | 7/2011 | Kim et al. | |
| 2011/0180312 A1 | 7/2011 | Kim et al. | |
| 2011/0315440 A1 | 12/2011 | Kim | |

FOREIGN PATENT DOCUMENTS

| | | |
|---|---|---|
| JP | 2009-088468 A | 4/2009 |
| JP | 2009-111132 A | 5/2009 |
| JP | 2010-010183 A | 1/2010 |

* cited by examiner

US 2005/0195051 A1

| | Mechanically-Unbalanced | Mechanically-Balanced |
|---|---|---|
| Internal | Internal "T" <br>US Pat. 5,886,597 | Internal "double T" <br>US Pat. 6,542,342<br>Internal "I"  |
| External | External "T" <br>US Pat. 5,886,597 | External "I"  |
| Hybrid | | Hybrid "I"  |

STRUCTURAL BODY AND INTERCONNECT SUBSTRATE

TECHNICAL FIELD

The present invention relates to a structural body and an interconnect substrate.

BACKGROUND ART

In recent years, it has been obvious that the propagation characteristics of electromagnetic waves are able to be controlled by periodically disposing conductor patterns having a specific structure (hereinafter, referred to as a "metamaterial"). Particularly, a metamaterial formed so as to suppress the propagation of electromagnetic waves in a specific frequency band is called an electromagnetic band gap structure (hereinafter, referred to as an "EBG structure"), and an attempt to suppress noise propagation between a power plane and a ground plane by applying the EBG structure to an interconnect substrate has been reported.

For example, Patent Document 1 (Specification of U.S. Patent Application Publication No. 2005/0195051) discloses a so-called mushroom-type EBG structure, as shown in FIG. 24, in which a plurality of insular conductor elements are disposed on a layer between two conductor planes opposite to each other and each of the insular conductor elements is connected to a conductor plane through a via, and a modified example thereof.

RELATED DOCUMENT

Patent Document

[Patent Document 1] Specification of U.S. Patent Application Publication No. 2005/0195051

DISCLOSURE OF THE INVENTION

In the above-mentioned mushroom-type EBG structure, it is necessary to provide a layer on which a conductor element is disposed (hereinafter, referred to as a "conductor element layer") in addition to a layer on which conductor planes opposite to each other are disposed. Particularly, when there are three conductor planes, two parallel plates serving as a noise propagation path are made, and thus it is necessary to provide an EBG structure in each of the parallel plates. That is, two conductor element layers are required.

For this reason, there is a problem in that a structural body with an EBG structure in the related art (hereinafter, referred to as the "EBG structural body") having three conductor planes contains a large number of laminations and thus the thickness thereof increases.

In addition, when the EBG structure in the related art having three conductor planes is applied to an interconnect substrate, there is a problem in that the interconnect substrate contains a large number of laminations and thus the thickness of the interconnect substrate increases.

Further, the manufacturing costs of the EBG structural body and the interconnect substrate increase due to the large number of laminations.

The invention is contrived in view of such circumstances, and an object thereof is to provide an EBG structural body and an interconnect substrate which are capable of realizing a further reduction in thickness and a further reduction in cost than those of an EBG structural body having an EBG structure in the related art and an interconnect substrate, by realizing an EBG structure with a number of layers smaller than that of the EBG structure in the related art in an EBG structure having three conductor planes.

According to the invention, there is provided a structural body including: a first conductor and a second conductor of which at least portions are opposite to each other; a third conductor, interposed between the first conductor and the second conductor, of which at least a portion is opposite to the first conductor and the second conductor, and which has a first opening; an interconnect provided in the inside of the first opening; and a conductor via which is electrically connected to the first conductor and the second conductor and is electrically insulated from the third conductor, wherein the interconnect is opposite to the first conductor and the second conductor, one end thereof being electrically connected to the third conductor at the edge of the first opening and the other end thereof being formed as an open end.

In addition, according to the invention, there is provided an interconnect substrate including a laminated structure formed including an electric conductor and a dielectric, wherein the interconnect substrate includes at least one of the above-mentioned structural bodies within the laminated structure.

According to the invention, it is possible to provide an EBG structural body and an interconnect substrate which are capable of realizing a further reduction in thickness and a further reduction in cost than those of an EBG structural body having an EBG structure in the related art and an interconnect substrate, by realizing an EBG structure with a number of layers smaller than that of the EBG structure in the related art in an EBG structure having three conductor planes.

BRIEF DESCRIPTION OF THE DRAWINGS

The above-mentioned objects, other objects, features and advantages will be made clearer from the preferred embodiments described below, and the following accompanying drawings.

DESCRIPTION OF EMBODIMENTS

Figure 1:
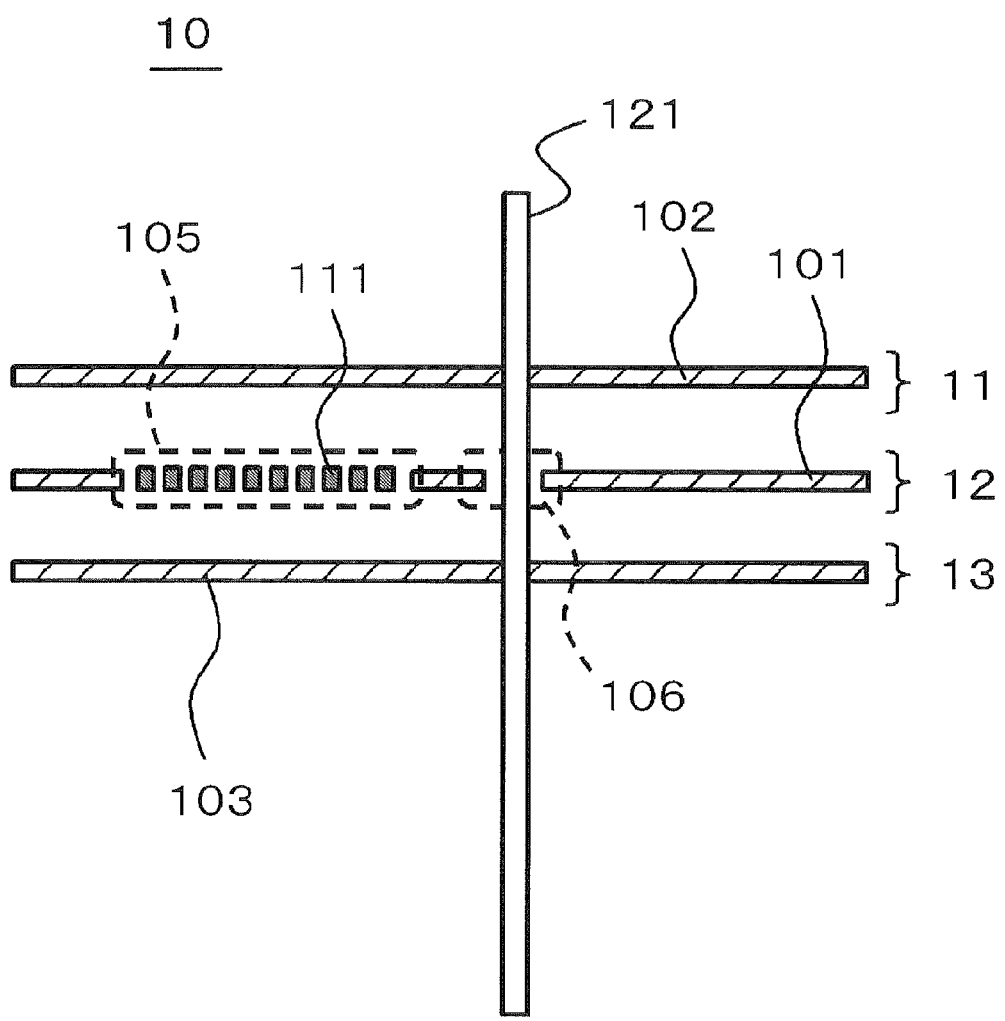
FIG. 1 is a cross-sectional view illustrating an example of a structural body according to a first embodiment.

Hereinafter, the embodiments of the invention will be described with reference to the accompanying drawings. In all the drawings, like elements are referenced by like reference numerals and signs and descriptions thereof will not be repeated.

First Embodiment

Figure 2:
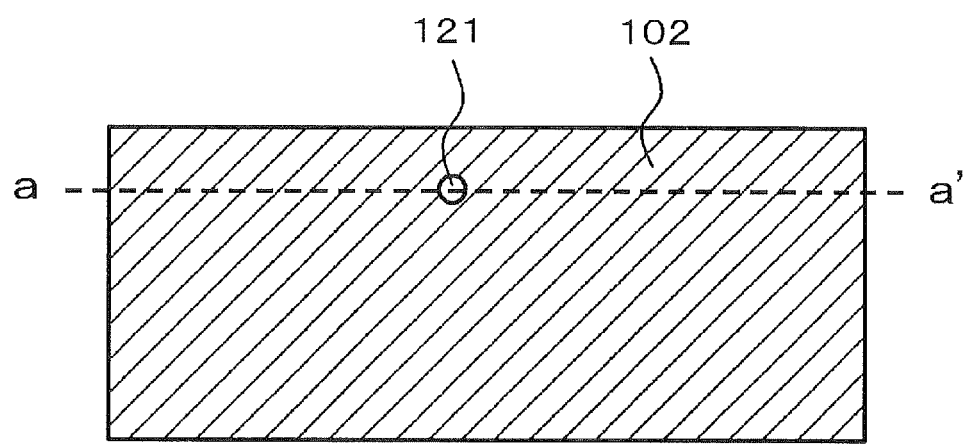
FIG. 2 is a top view illustrating an example of the structural body according to the first embodiment.
Figure 3:
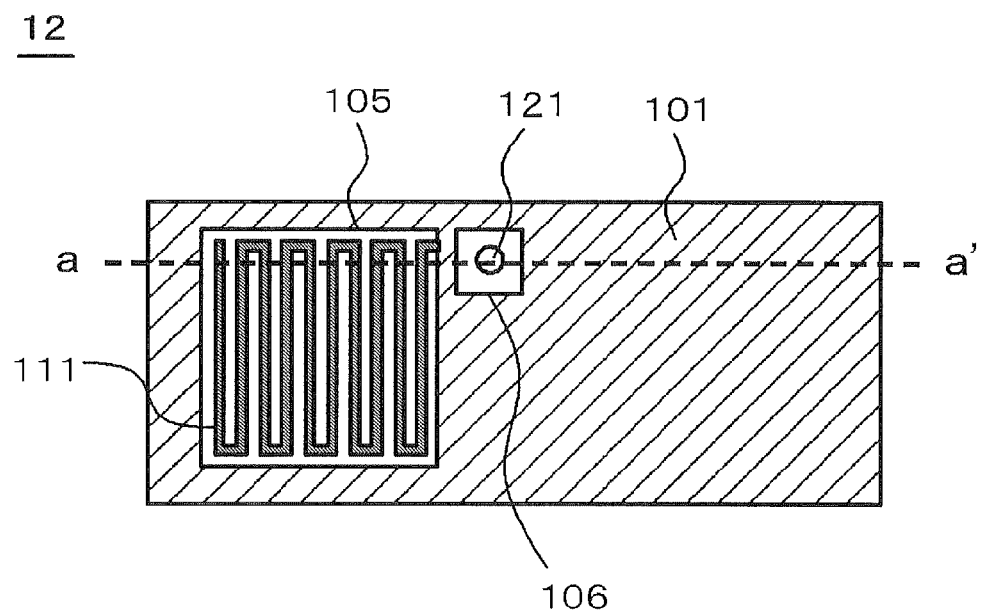
FIG. 3 is a top view illustrating an example of the structural body according to the first embodiment.
Figure 4:
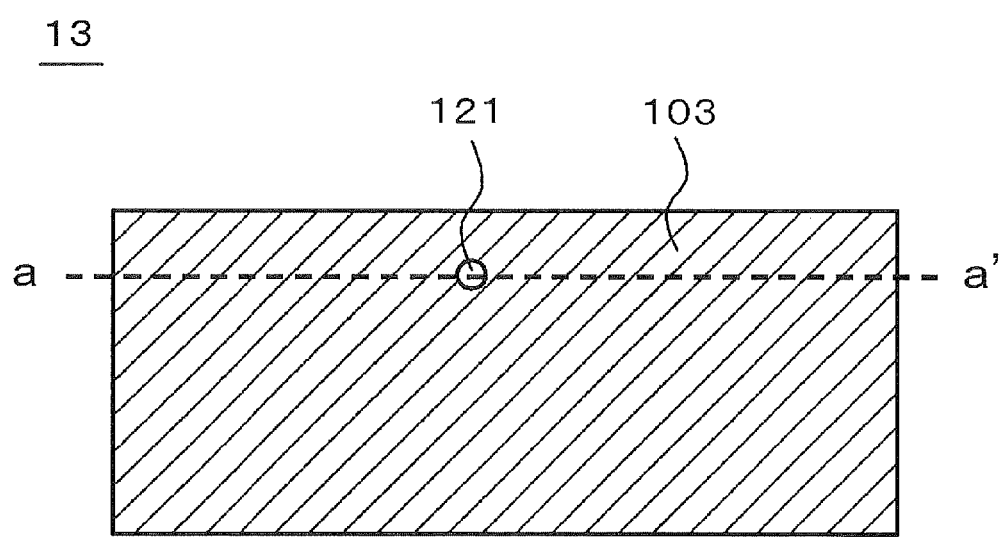
FIG. 4 is a top view illustrating an example of the structural body according to the first embodiment.

FIG. 1 is a cross-sectional view illustrating an example of a structural body 10 according to a first embodiment of the invention. FIGS. 2 to 4 are top views illustrating an example of the structural body 10 according to the first embodiment of the invention. Specifically, FIG. 2 is a top view in an A layer 11, FIG. 3 is a top view in a B layer 12, and FIG. 4 is a top view in a C layer 13. FIG. 1 is equivalent to a cross-sectional view taken along the line a-a' in FIGS. 2 to 4.

As shown in FIG. 1, the structural body 10 includes a first conductor 102, a second conductor 103, a third conductor 101, a first opening 105 and a second opening 106 which are provided in the third conductor 101, an interconnect 111, and a conductor via 121.

The structural body 10 having such components can be constituted by, for example, various types of conductive components formed in an interconnect substrate.

In the structural body 10 shown in FIG. 1, the first conductor 102 provided in the A layer 11 and the second conductor 103 provided in a C layer 13 located below the A layer 11 are disposed so that at least portions thereof are opposite to each other with the B layer 12 interposed therebetween.

The third conductor 101 is disposed in the B layer 12. At least a portion of the third conductor 101 is opposite to the first conductor 102 and the second conductor 103, for example, with a dielectric interposed therebetween.

The first opening 105 and the second opening 106 are provided in the third conductor 101. At least one interconnect 111 is included in the inside of the first opening 105. In addition, at least one conductor via 121, electrically connecting the first conductor 102 and the second conductor 103, which is insulated from the third conductor 101 passes through the inside of the second opening 106. The conductor via 121 passes through the second opening 106 in a state of non-contact with the third conductor 101.

The interconnect 111 is formed opposite to the first conductor 102 and the second conductor 103, for example, with a dielectric interposed therebetween. One end thereof is connected to the third conductor 101 at the edge of the first opening 105, and the other end thereof is formed as an open end (see FIG. 3).

The first conductor 102, the second conductor 103, the third conductor 101, the interconnect 111, and the conductor via 121 can be formed of a copper foil, but may be formed of other materials insofar as they are conductive. In addition, each of them may be formed of the same material, and may be formed of a different material.

Meanwhile, when the structural body 10 is constituted by various types of conductive components formed in the interconnect substrate, the third conductor 101 and the interconnect 111 are provided on the same layer as the interconnect substrate having a laminated structure.

In addition, the structural body 10 may include layers other than the A layer 11, the B layer 12 and the C layer 13 mentioned above. For example, a dielectric layer may be located between the A layer 11 and the B layer 12, and between the B layer 12 and the C layer 13. In addition, the structural body 10 may include a hole, a via, a signal line or the like which are not shown, somewhere else, in the range consistent with the configuration of the invention.

In addition, the first opening 105 and the second opening 106 are not necessarily hollow, but a dielectric may be filled in the inside thereof.

In the structural body 10, the first conductor 102 and the second conductor 103 may be connected to a ground terminal of an electronic element such as an LSI, and may be caused to function as a ground plane providing a ground potential to the electronic element. In addition, the third conductor 101 may be connected to a power supply terminal of the electronic element such as an LSI, and may be caused to function as a power plane providing a power supply potential to the electronic element. Furthermore, the first conductor 102 and the second conductor 103 may be caused to function as a power plane, and the third conductor 101 may be caused to function as a ground plane.

Next, the effects and operations of the embodiment will be described.

According to the embodiment, the interconnect 111 included in the structural body 10 is electrically coupled to the first conductor 102 and the second conductor 103 which are opposite thereto, and forms a strip line using the first conductor 102 and the second conductor 103 as a return path. The strip line has an open end, and thus operates as an open stub. Particularly, in the resonance frequency of which the length of the strip line (length of the open stub) is approximately ¼ of the wavelength of an electromagnetic wave, the third conductor 101 and each of the first conductor 102 and the second conductor 103 are electrically short-circuited at the connection point of the interconnect 111 and the third conductor 101, and the center frequency of a band gap is provided. Thereby, noise propagation in a parallel plate waveguide can be suppressed in the vicinity of the resonance frequency.

The structural body 10 of the embodiment includes a parallel plate waveguide formed including the first conductor 102 and the third conductor 101, a parallel plate waveguide formed including the third conductor 101 and the second conductor 103, the interconnect 111, and the conductor via 121, and thus an open stub-type EBG structure is formed. According to the embodiment, even when three conductor planes are present in the interconnect substrate, an EBG structure can be formed without the addition of any layers, thereby allowing the interconnect substrate to be manufactured thinner and at lower cost than in the related art.

According to the embodiment, since the above-mentioned resonance frequency can be lowered by increasing the length of the strip line (length of the open stub), a lowering in frequency and a reduction in size of the EBG structure are facilitated.

Meanwhile, the first conductor 102 and the second conductor 103 which are opposite to the interconnect 111 forming the strip line are preferably close to each other. This is because as the distance between the conductors which are opposite to the interconnect decreases, the characteristic impedance of the strip line becomes lower, and thus the band gap zone can be widened. However, even when the interconnect 111 is not brought close to the first conductor 102 and the second conductor 103 which are opposite thereto, the essential effect of the invention is not influenced at all.

In addition, since the structural body 10 according to the embodiment has the largest noise propagation suppressing effect at the resonance frequency, the structural body is preferably formed so that the frequency of noise electromagnetic waves of which the propagation has to be suppressed and the resonance frequency are approximately consistent with each other. The phrase "noise electromagnetic waves of which the propagation has to be suppressed" herein indicates that the frequency thereof is consistent with the operating frequency of an electronic element, having a tendency to be influenced by noise, which is disposed in the interconnect substrate or in the vicinity of the interconnect substrate, out of wideband noise electromagnetic waves generated in a digital circuit or the like. However, the resonance frequency and the frequency of the noise electromagnetic waves are not necessarily required to be completely consistent with each other, and the essential effect of the invention is not influenced at all even when they are out of synchronization with each other.

Figure 5:
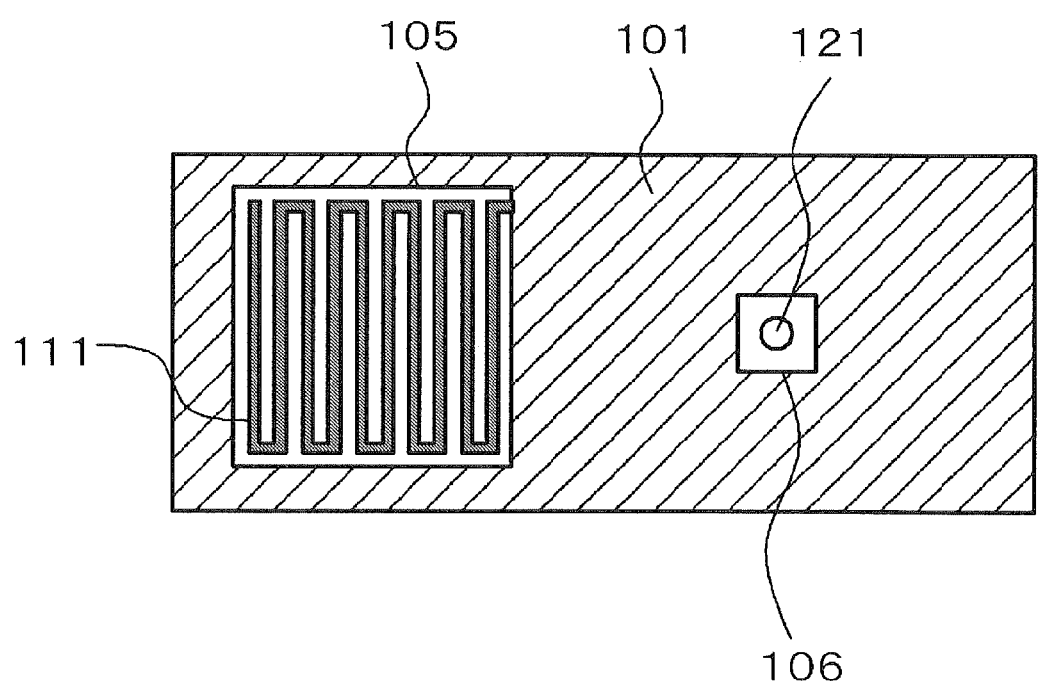
FIG. 5 is a top view illustrating an example of the structural body according to the first embodiment.

In the structural body 10 according to the embodiment, at least one conductor via 121 is preferably provided at a position equal to or less than ½ of the wavelength of the noise electromagnetic wave from the connection point of the interconnect 111 and the third conductor 101. This is because when the distance between the above-mentioned connection point and the conductor via 121 is equal to ½ of the wavelength of the noise electromagnetic wave, the half wavelength resonance occurs between the above-mentioned connection point and the conductor via 121, and thus unnecessary emission is caused. Meanwhile, for example, as shown in FIG. 5, when the distance is in the range of ½ of the wavelength of the noise electromagnetic wave, the conductor via 121 can also be disposed at a certain distance from the first opening 105.

Figure 6:
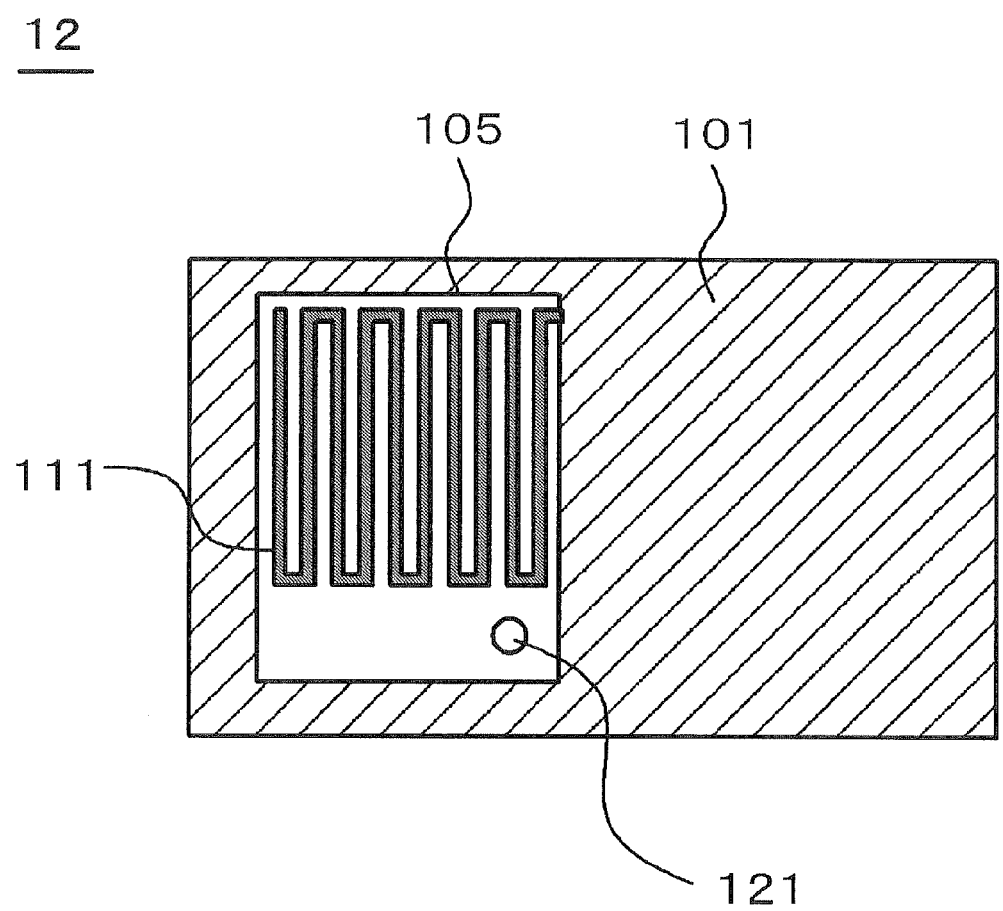
FIG. 6 is a top view illustrating an example of the structural body according to the first embodiment.

In addition, when the conductor via 121 and the third conductor 101 are electrically insulated from each other, any configuration may be used. For example, as shown in FIG. 6, the conductor via 121 may pass through the inside of the first opening 105, rather than the second opening 106, in a state of non-contact with the interconnect 111 and the third conductor 101. In this case, the second opening 106 becomes unnecessary.

Figure 7:
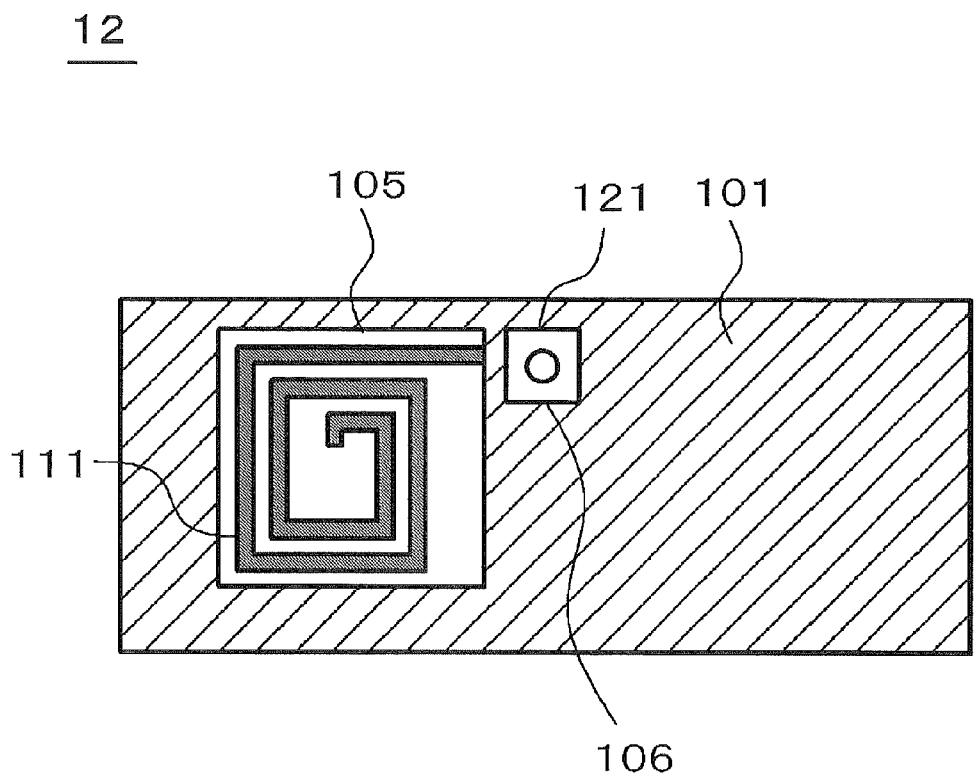
FIG. 7 is a top view illustrating an example of the structural body according to the first embodiment.
Figure 8:
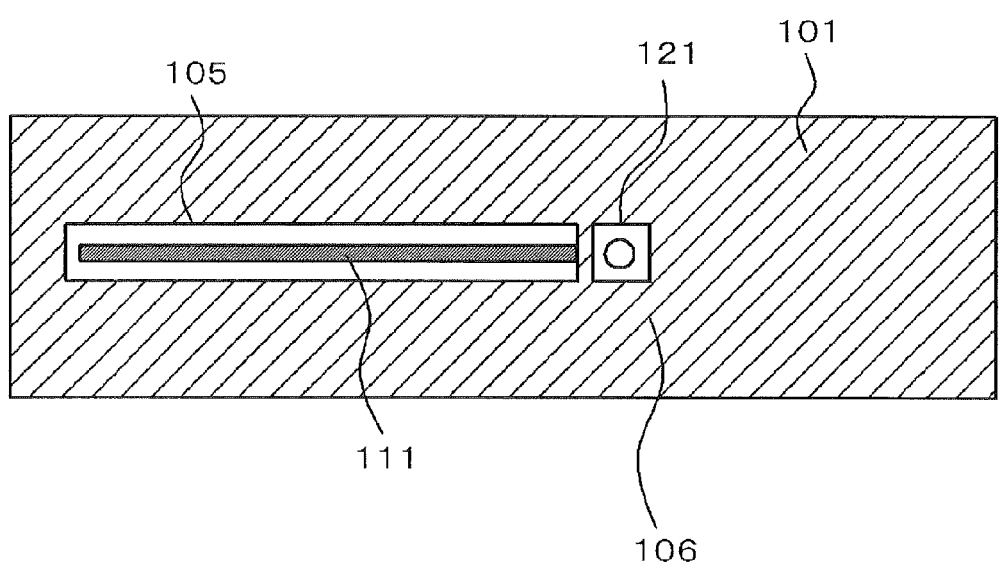
FIG. 8 is a top view illustrating an example of the structural body according to the first embodiment.

In addition, in FIGS. 1 and 3, the interconnect 111 formed in a meandering shape is shown as an example of the structural body 10. However, when the interconnect 111 is configured to form a strip line having a required line length, the interconnect may be formed in any shape, and is not necessarily limited to a meandering shape. For example, the interconnect may be formed in a spiral shape shown in FIG. 7, and may be formed in a linear shape shown in FIG. 8.

Figure 9:
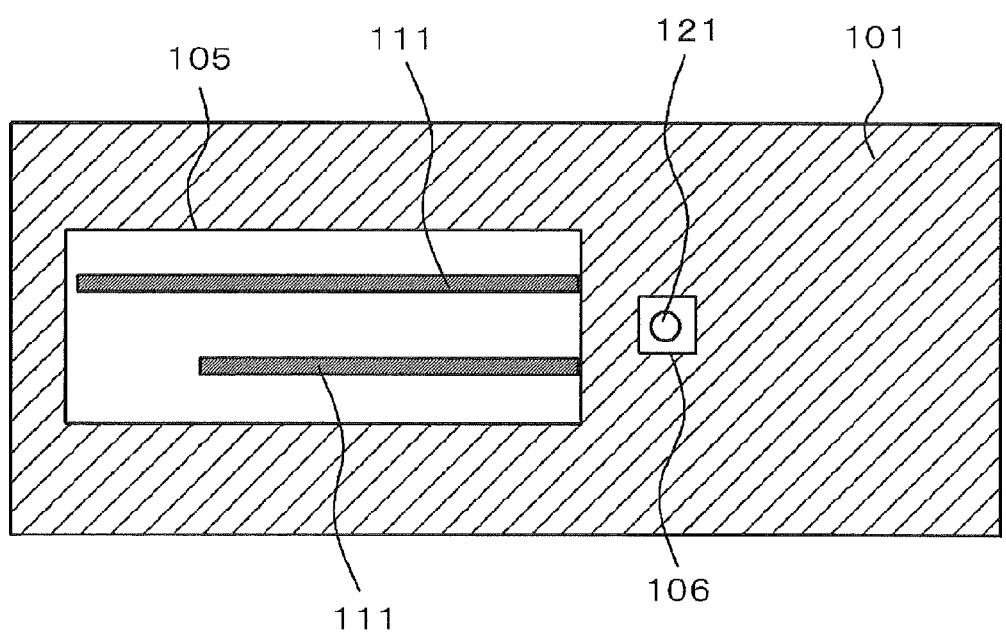
FIG. 9 is a top view illustrating an example of the structural body according to the first embodiment.
Figure 10:
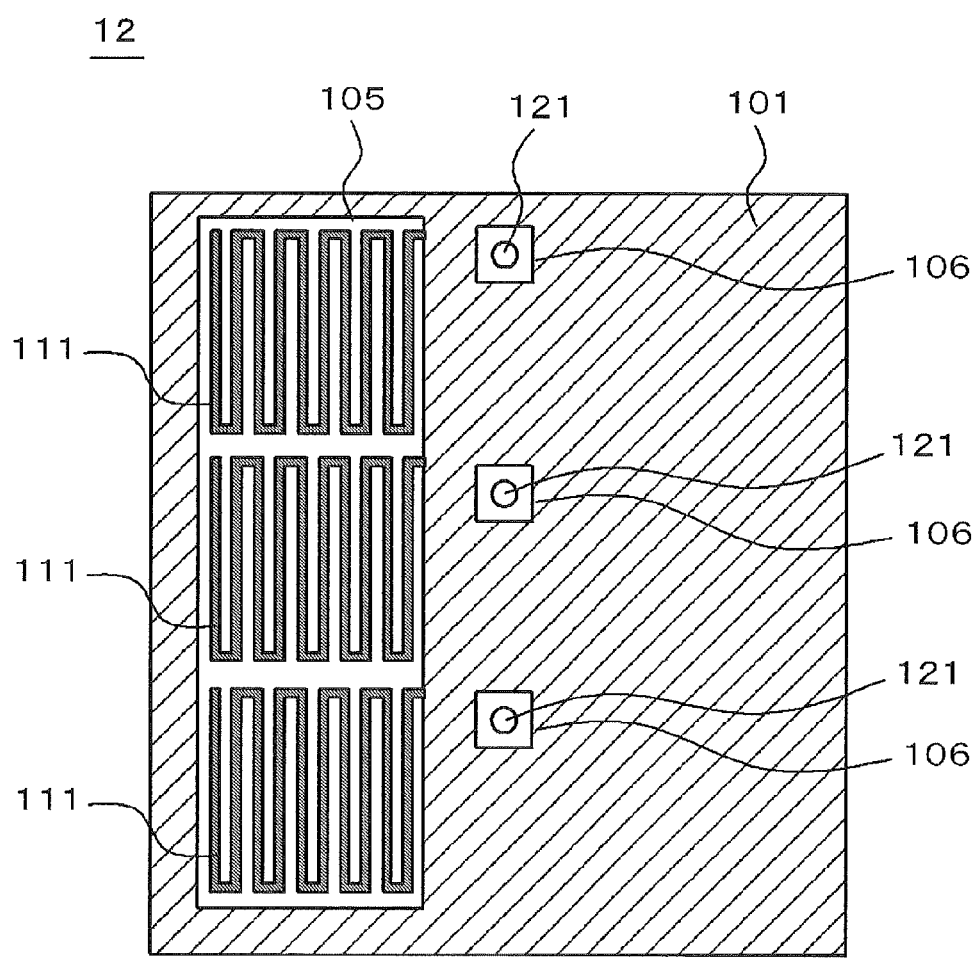
FIG. 10 is a top view illustrating an example of the structural body according to the first embodiment.

In addition, a plurality of interconnects 111 may be disposed in the inside of the first opening 105. Particularly, as shown in FIG. 9, when the lengths of a plurality of interconnects 111 within the same opening are configured to be different from each other, each of the interconnects 111 causes resonance at a different frequency, and thus the band gap can be divided into multi-bands. In this case, when the distance between the connection point of each of the interconnects 111 and the third conductor 101 and the conductor via 121 satisfies the above-mentioned conditions, as shown in FIG. 9, one conductor via 121 may be provided, and a plurality thereof are not required to be provided. In addition, as shown in FIG. 10, a plurality of conductor vias 121 can also be provided in one first opening 105.

Figure 11:
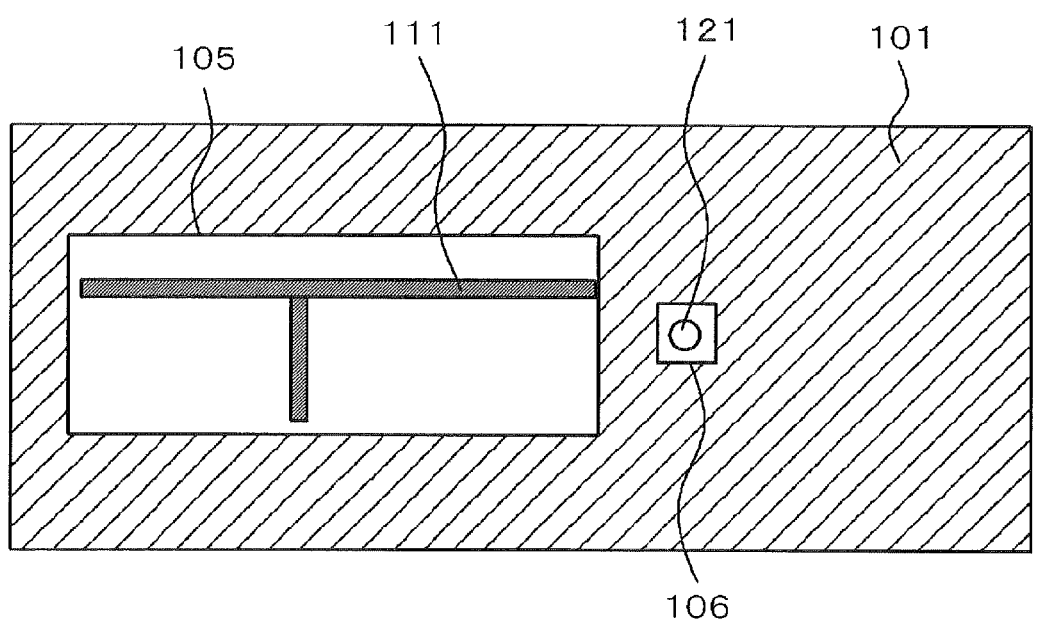
FIG. 11 is a top view illustrating an example of the structural body according to the first embodiment.

In addition, as shown in FIG. 11, the interconnect 111 may be configured to have a plurality of branches. In this case, the band gap can be divided into multi-bands similarly. Meanwhile, at least a portion of a plurality of interconnects 111 disposed in the inside of one first opening 105 as shown in FIG. 9 may have a branch as shown in FIG. 11.

In addition, in FIGS. 1 to 4, a configuration is shown in which the conductor via 121 of the structural body 10 is formed by a through via. In this case, even when the conductor via 121 is connected to other elements, included in the interconnect substrate, in layers other than the A layer 11, the B layer 12 and the C layer 13, the essential effect of the invention is not influenced at all. In addition, the conductor via 121 can also be formed by a non-through via which does not pass through the upper side of the A layer 11 and does not pass through the lower side of the C layer 13.

When the interconnect substrate is a multilayer substrate capable of forming the structural body 10, any material and process may be used. For example, the interconnect substrate may be a printed substrate using a glass epoxy resin, may be an interposer substrate such as an LSI, may be a module substrate using a ceramic material such as LTCC, and may naturally be a semiconductor substrate such as silicon.

Second Embodiment

Figure 12:
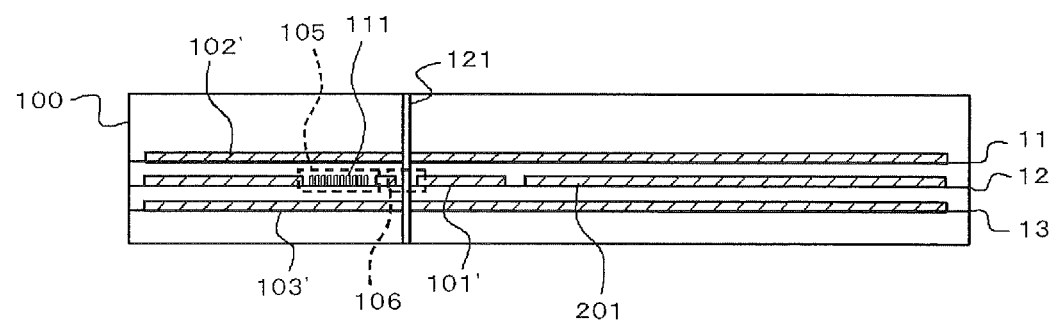
FIG. 12 is a cross-sectional view illustrating an example of an interconnect substrate according to a second embodiment.
Figure 13:
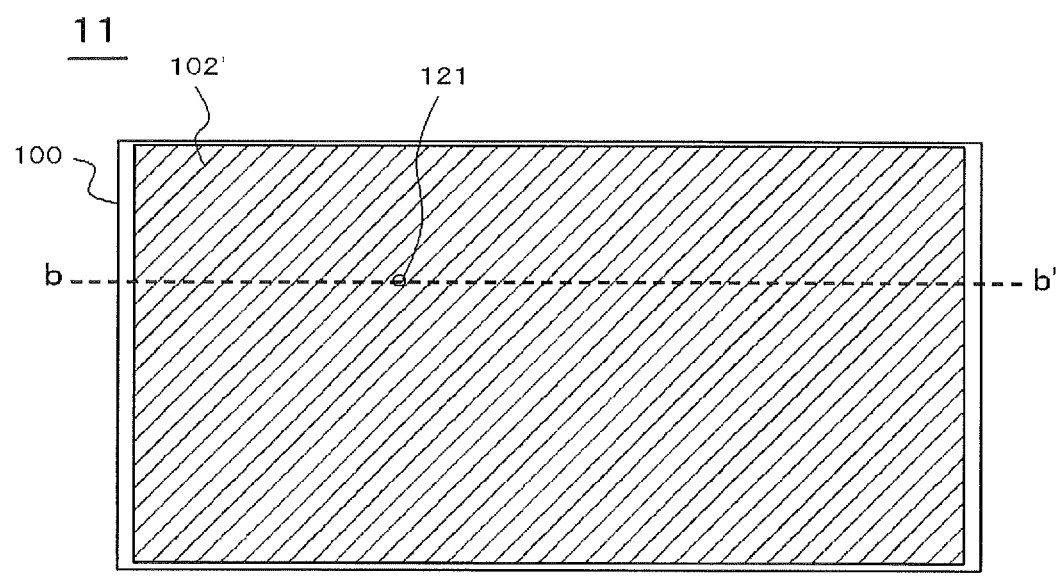
FIG. 13 is a top view illustrating an example of the interconnect substrate according to the second embodiment.
Figure 14:
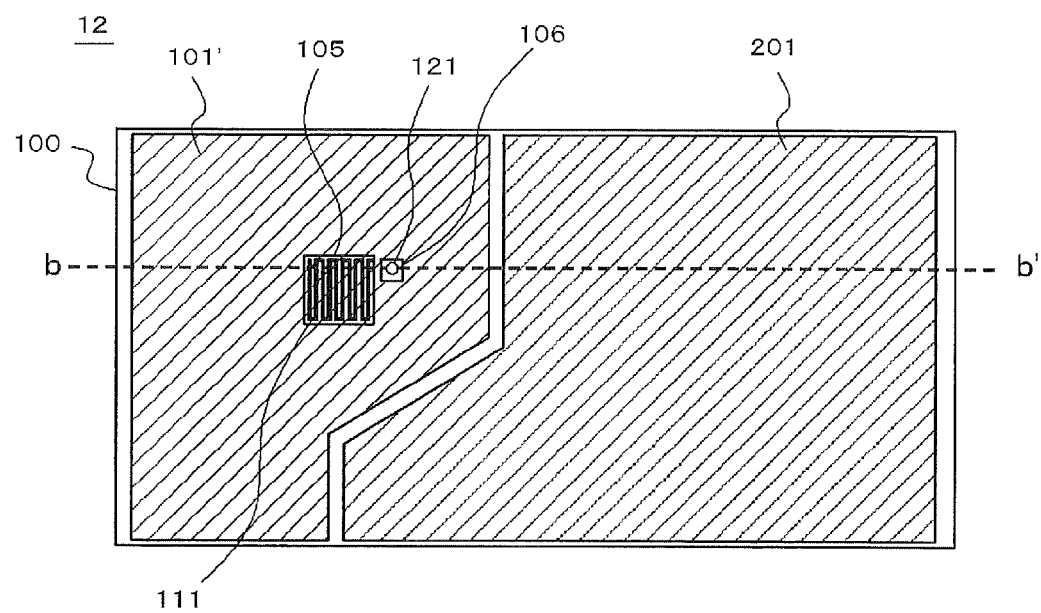
FIG. 14 is a top view illustrating an example of the interconnect substrate according to the second embodiment.
Figure 15:
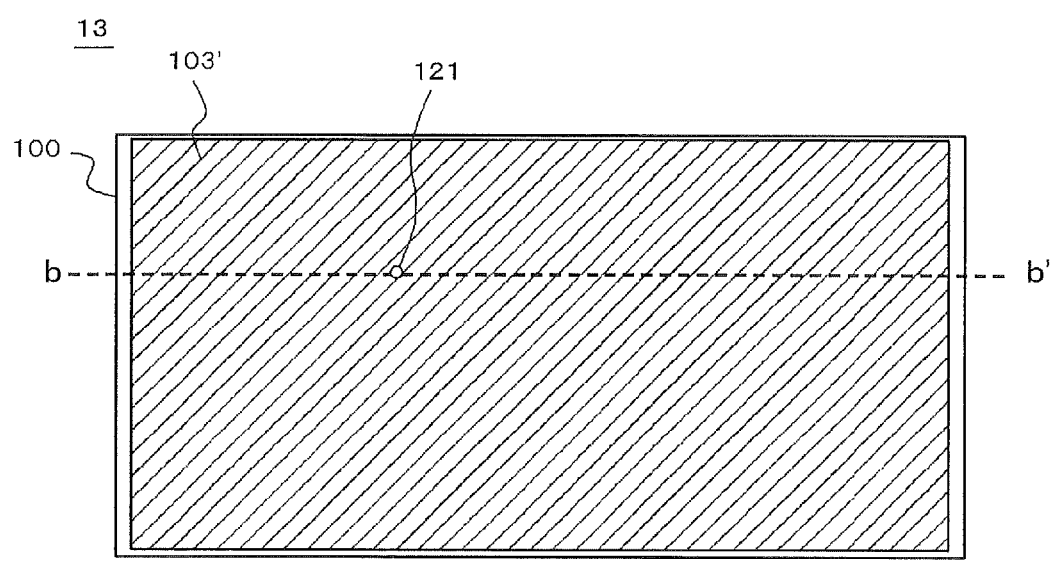
FIG. 15 is a top view illustrating an example of the interconnect substrate according to the second embodiment.

FIG. 12 is a cross-sectional view illustrating an example of an interconnect substrate 100 according to a second embodiment of the invention. FIGS. 13 to 15 are top views illustrating an example of the interconnect substrate 100 according to the second embodiment of the invention. Specifically, FIG. 13 is a top view in the A layer 11, FIG. 14 is a top view in the B layer 12, and FIG. 15 is a top view in the C layer 13. FIG. 12 is equivalent to a cross-sectional view taken along the line b-b' in FIGS. 13 to 15.

Meanwhile, the second embodiment is an embodiment in which the structural body 10 of the first embodiment is constituted by various types of conductive components formed in the interconnect substrate 100.

As shown in FIGS. 12 and 13, the interconnect substrate 100 according to the embodiment is configured such that a first ground plane 102' is disposed in the A layer 11, a first power plane 101' and a second power plane 201 are disposed in the B layer 12 located below the A layer 11, and a second ground plane 103' is disposed in the C layer 13 located below the B layer 12. The first power plane 101' and the second power plane 201 are insulated from each other.

Meanwhile, the first ground plane 102' is equivalent to the first conductor 102 of the structural body 10 in the first embodiment, the first power plane 101' is equivalent to the third conductor 101 of the structural body 10 in the first embodiment, and the second ground plane 103' is equivalent to the second conductor 103 of the structural body 10 in the first embodiment. That is, the first power plane 101' has a first opening 105, and an interconnect is located in the inside of the first opening 105. In addition, the first power plane 101' has a second opening 106, and the conductor via 121 passes through the inside of the second opening 106 in a state of non-contact with the first power plane 101'.

As shown in FIGS. 12 and 14, conductor elements other than the structural body 10, for example, the second power plane 201, a transmission line that transmits a signal, and the like may be included in the B layer 12 in the range consistent with the configuration of the structural body 10. In addition, conductor elements other than the structural body 10 may be included in the A layer 11 and the C layer 13 similarly in the range consistent with the configuration of the structural body 10. In addition, the interconnect substrate 100 may include layers different from the A layer 11, the B layer 12, and the C layer 13, and may include components other than the above-mentioned components, for example, a ground plane, a power plane, a transmission line and the like in these layers. Furthermore, for example, a dielectric layer may be provided between the A layer 11 and the B layer 12, and between the B layer 12 and the C layer 13.

In the interconnect substrate 100 of the embodiment, the first ground plane 102' of the A layer 11, the first power plane 101' of the B layer 12, and the second ground plane 103' of the C layer 13 are used as the first conductor 102, the third conductor 101, and the second conductor 103 of the above-mentioned structural body 10, and thus an EBG structure is formed including the first ground plane 102', the first power plane 101', the second ground plane 103', the interconnect 111, the first opening 105, the second opening 106, and the conductor via 121.

With such a configuration, the interconnect substrate 100 of the embodiment can suppress noise propagation between parallel plates formed by the first ground plane 102' and the first power plane 101' and noise resonance in the parallel plates. In addition, with such a configuration, the interconnect substrate 100 of the embodiment can suppress noise propagation between parallel plates formed by the first power plane 101' and the second ground plane 103' and noise resonance in the parallel plates.

When the noise resonance in the parallel plate is suppressed, the structural body 10 is preferably disposed in the vicinity of a region having a maximum voltage magnitude between the parallel plates due to the resonance, but the essential effect of the invention is not influenced at all even in the case where the structural body 10 is disposed in another place.

Figure 16:
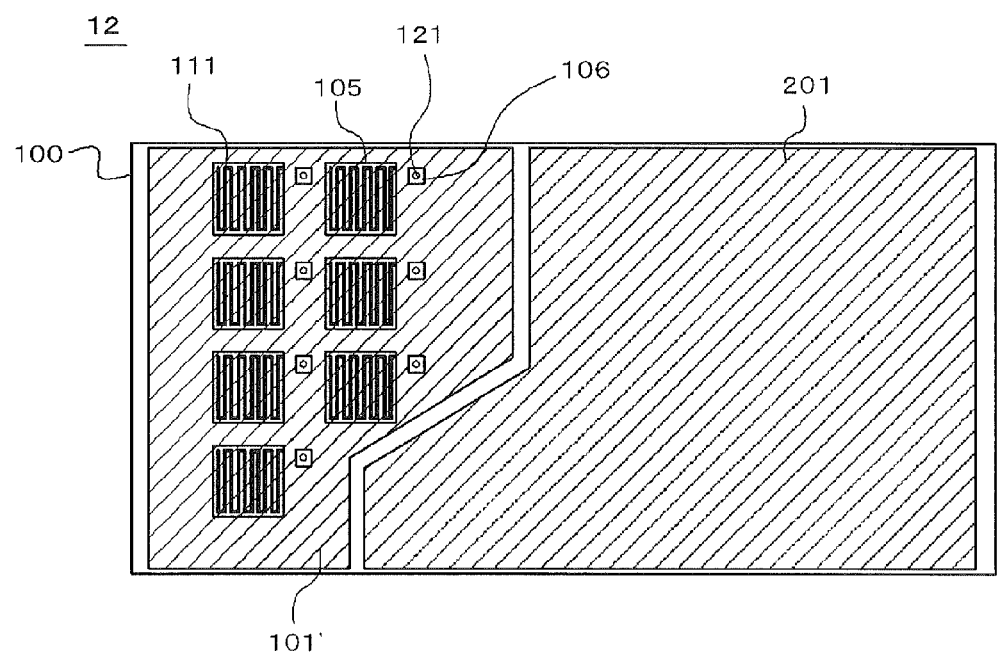
FIG. 16 is a top view illustrating an example of the interconnect substrate according to the second embodiment.

In addition, the interconnect substrate 100 shown in FIG. 14 includes the first power plane 101' with one first opening 105 having the interconnect 111 therein. However, as shown in FIG. 16, the interconnect substrate 100 may include the first power plane 101' with a plurality of first openings 105 having the interconnect 111 therein. That is, one structural body 10 may be disposed in the interconnect substrate 100, or a plurality of structural bodies 10 may be disposed in accordance with a noise propagation path or a noise resonance mode. Particularly, when a plurality of structural bodies 10 are repeatedly disposed, a wider-band noise propagation suppressing effect can be obtained by the occurrence of Bragg reflection based on repeated periodicity in addition to the essential effect of the structural body 10.

Herein, when the "repeated" structural bodies 10 are disposed, it is preferable that the distance (center-to-center distance) between the conductor vias 121 is set to be within ½ of wavelength λ of targeting electromagnetic waves, in the structural bodies 10 adjacent to each other. In addition, "repeated" also includes a case where a portion of the configuration is missing in any of the structural bodies 10. In addition, when the structural bodies 10 have a two-dimensional array, "repeated" also includes a case where the structural bodies 10 are partially missing. In addition, "periodic" also includes a case where a portion of the components is out of alignment in some structural bodies 10, or a case where the disposition of some structural bodies 10 in themselves is out of alignment. That is, even when periodicity in a strict sense collapses, the characteristics as a metamaterial can be obtained in a case where the structural bodies 10 are repeatedly disposed, and thus some degree of defects is allowed in the "periodicity". Meanwhile, it is considered that factors for which these defects are generated include a case of passing the interconnect, the vias, or the connecting members between the structural bodies 10, a case where the structural bodies 10 cannot be disposed due to the existing vias, patterns, or connecting members, when a metamaterial structure is added to the existing interconnect layout or inter-substrate connection structure, manufacturing errors, and a case where the existing vias, patterns, or connecting members are used as a portion of the structural body 10, and the like.

In the embodiment, as a mounting example in the actual interconnect substrate 100, a configuration is illustrated in which the first conductor 102 and the second conductor 103 are ground planes and the third conductor 101 is a power plane, but is not necessarily limited to such a configuration. For example, the interconnect substrate can also be configured such that the first conductor 102 and the second conductor 103 are power planes and the third conductor 101 is a ground plane.

Figure 17:
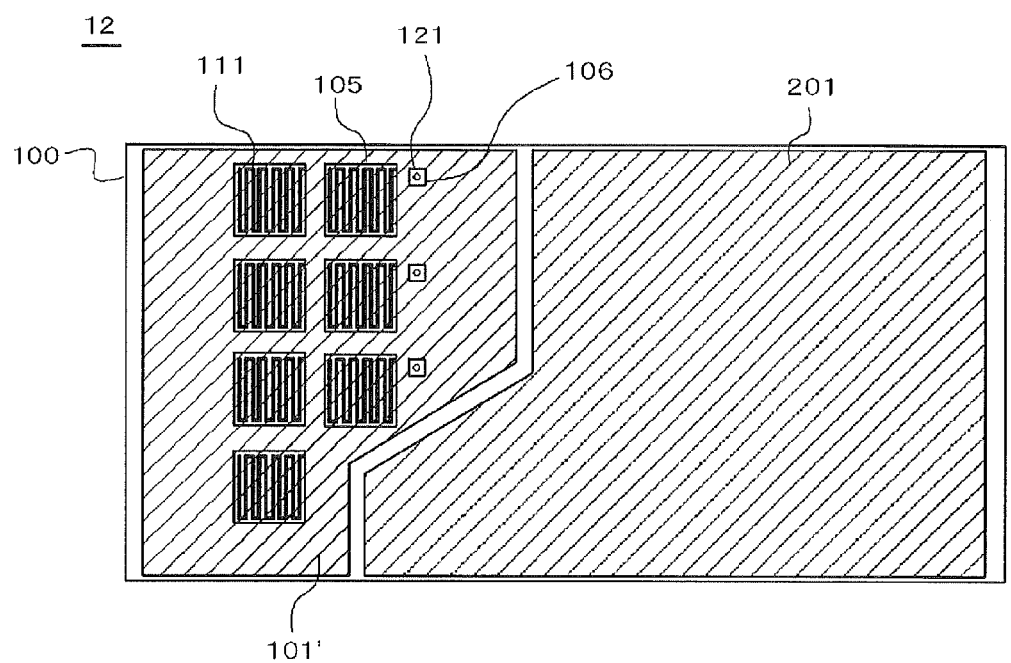
FIG. 17 is a top view illustrating an example of the interconnect substrate according to the second embodiment.

Further, in the embodiment, as a mounting example in the actual interconnect substrate 100, the configuration is illustrated in which the first opening 105 and the conductor via 121 form a pair, but is not necessarily limited to such a configuration. For example, as shown in FIG. 17, the conductor via 121 can also be provided only about half the first opening 105. The mounting area of the structural body 10 can be reduced by the configuration as shown in FIG. 17. In addition, even in the case of FIG. 17, at least one conductor via 121 is disposed at a position equal to or less than ½ of the wavelength of the noise electromagnetic wave from the connection point of the interconnect 111 and the first power plane 101', thereby allowing the same operations and effects as the operations and effects described in the first embodiment to be obtained.

Third Embodiment

Figure 18:
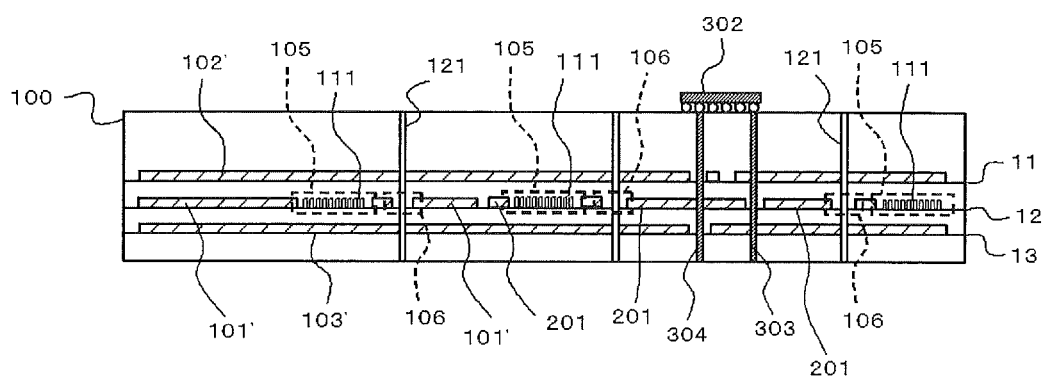
FIG. 18 is a cross-sectional view illustrating an example of an interconnect substrate according to a third embodiment.
Figure 19:
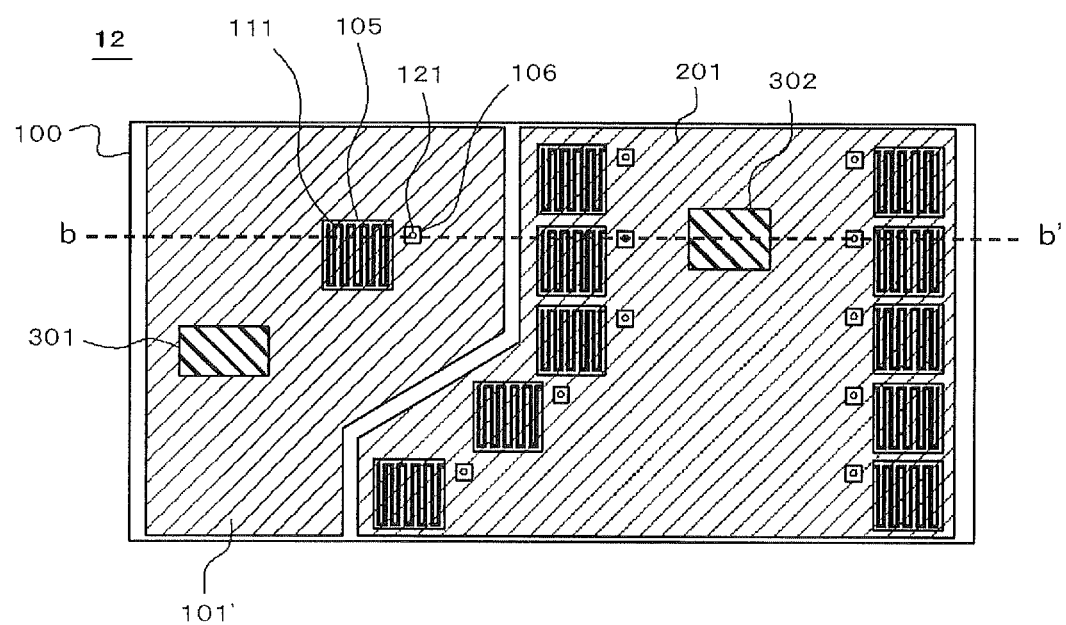
FIG. 19 is a top view illustrating an example of the interconnect substrate according to the third embodiment.

FIG. 18 is a cross-sectional view illustrating an example of the interconnect substrate 100 according to a third embodiment of the invention. FIG. 19 is a top view illustrating an example of the interconnect substrate 100 according to the third embodiment of the invention, and specifically is a top view in the B layer 12. FIG. 18 is equivalent to the cross-sectional view taken along the line b-b' in FIG. 19. The interconnect substrate 100 according to the embodiment is the same as that of the second embodiment, except for the following points.

First, an analog electronic element 301 that processes an analog signal and a digital electronic element 302 that processes a digital signal are mounted onto the surface layer of the interconnect substrate 100 according to the embodiment.

As shown in FIG. 18, a ground terminal of the digital electronic element 302 is connected to a ground via 303. The ground via 303 is connected to the first ground plane 102' and the second ground plane 103', and is insulated from the second power plane 201. That is, the ground via 303 passes through an opening provided in the second power plane 201 in a state of non-contact with the second power plane 201. In addition, a power supply terminal of the digital electronic element 302 is connected to a power supply via 304. The power supply via 304 is connected to the second power plane 201, and is insulated from the first ground plane 102' and the second ground plane 103'. That is, the power supply via 304 passes through openings provided in the first ground plane 102' and the second ground plane 103' in a state of non-contact with the first ground plane 102' and the second ground plane 103'.

In addition, a ground terminal, not shown, of the analog electronic element 301 is connected to the first ground plane 102' and the second ground plane 103', and is insulated from the first power plane 101'. In addition, a power supply terminal, not shown, of the analog electronic element 301 is connected to the first power plane 101', and is insulated from the first ground plane 102' and the second ground plane 103'. Meanwhile, a unit that realizes a state of the connection and insulation of the analog electronic element 301 can be realized similarly to a unit that connects and insulates the above-mentioned digital electronic element 302 to and from the planes.

Meanwhile, the first ground plane 102' is equivalent to the first conductor 102 in the structural body 10 of the first embodiment, the first power plane 101' and the second power plane 201 are equivalent to the third conductor 101 in the structural body 10 of the first embodiment, and the second ground plane 103' is equivalent to the second conductor 103 in the structural body 10 of the first embodiment.

At least a portion of noise generated in the digital electronic element 302 propagates through the ground via 303 and the power supply via 304 to a first parallel plate formed by the first ground plane 102' and the second power plane 201 and a second parallel plate formed by the second power plane 201 and the second ground plane 103'.

In such a case, the noise propagating to the above-mentioned parallel plates reaches the analog electronic element 301 directly, or indirectly through emission from the parallel plate ends, and thus there is a concern of causing reduced receiving sensitivity or a malfunction of the analog electronic element 301. The interconnect substrate 100 of the embodiment is configured to solve the above problem.

That is, in a region (hereinafter, referred to as the "digital region"), of the interconnect substrate 100 according to the embodiment, in which the second power plane 201 connected to the digital electronic element 302 extends, the first ground plane 102' of the A layer 11, the second power plane 201 of the B layer 12, and the second ground plane 103' of the C layer 13 are used as the first conductor 102, the third conductor 101, and the second conductor 103 of the structural body 10, respectively, and thus an EBG structure is formed including the first ground plane 102', the second power plane 201, the second ground plane 103', the interconnect 111, the first opening 105, the second opening 106, and the conductor via 121. Such a configuration can cause the noise generated in the digital electronic element 302 not to propagate to the region (hereinafter, referred to as the "analog region") side on which the first power plane 101' extends.

In addition, in the analog region of the interconnect substrate 100 according to the embodiment, the first ground plane 102' of the A layer 11, the first power plane 101' of the B layer 12, and the second ground plane 103' of the C layer 13 are used as the first conductor 102, the third conductor 101, and the second conductor 103 of the structural body 10, respectively, and thus the EBG structure is formed including the first ground plane 102', the first power plane 101', the second ground plane 103', the interconnect 111, the first opening 105, the second opening 106, and the conductor via 121. Such a configuration can cause the noise propagating from the digital region not to propagate to the analog electronic element 301.

As shown in FIG. 19, a plurality of structural bodies 10 are preferably disposed so as to surround at least one of the analog electronic element 301 or the digital electronic element 302. However, when at least one structural body is disposed in the periphery of at least one of the analog electronic element 301 or the digital electronic element 302, the essential effect of the invention can be obtained. Therefore, the arrangement pattern of the structural body 10 can take a plurality of aspects.

In addition, in the embodiment, as an example of an electronic element to be protected from noise, the analog electronic element 301 has been described by way of example. However, when the electronic element is a part or a circuit of which the performance deteriorates due to the influence of noise, any configuration may be used therefor. For example, an antenna and the like can also be considered.

In addition, in the embodiment, as an example of an electronic element that generates noise, the digital electronic element 302 has been described by way of example. However, when the electronic element is a part or circuit that generates noise, any configuration may be used therefor. For example, a power supply circuit and the like can also be considered.

Fourth Embodiment

Figure 20:
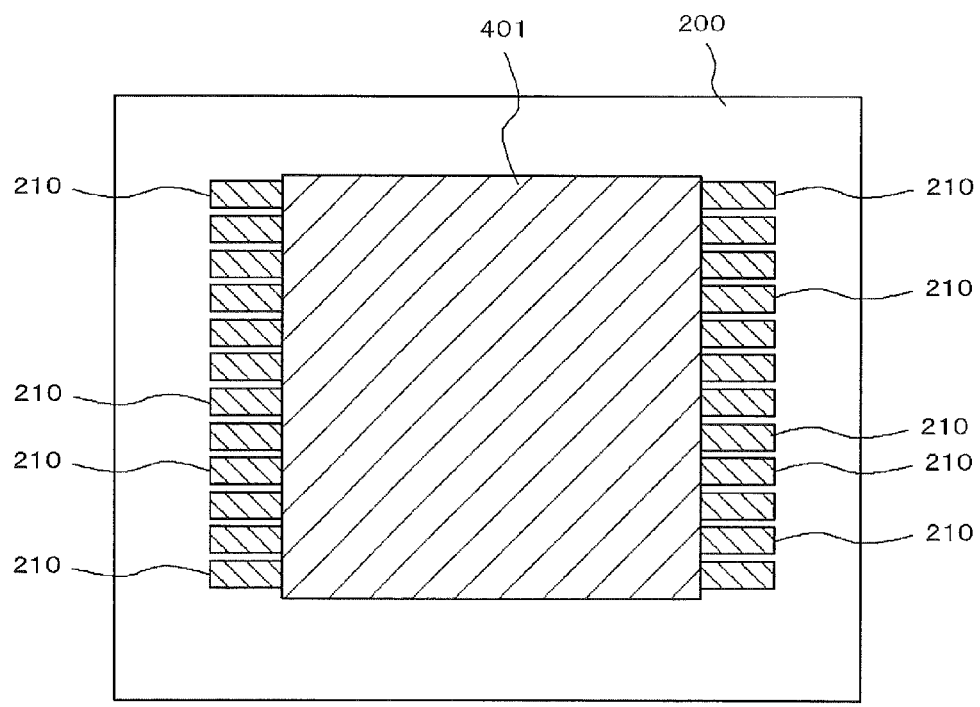
FIG. 20 is a top view illustrating an example of an interconnect substrate according to a fourth embodiment.
Figure 21:
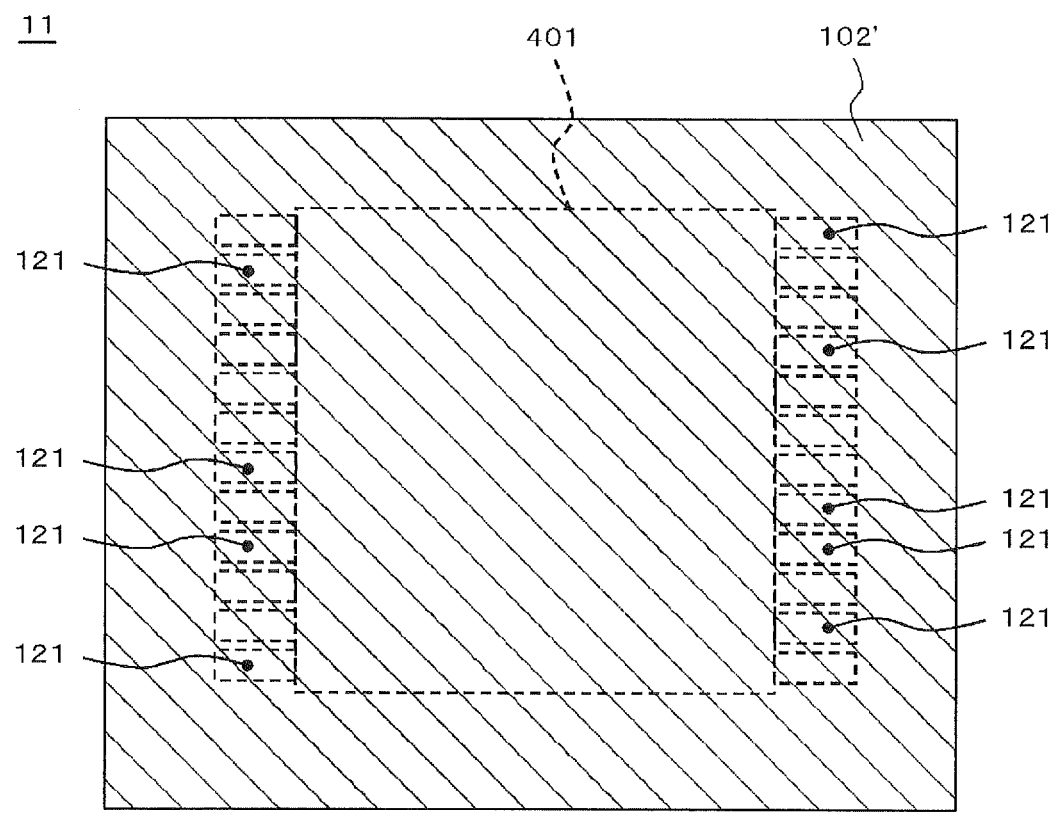
FIG. 21 is a top view illustrating an example of the interconnect substrate according to a fourth embodiment.
Figure 22:
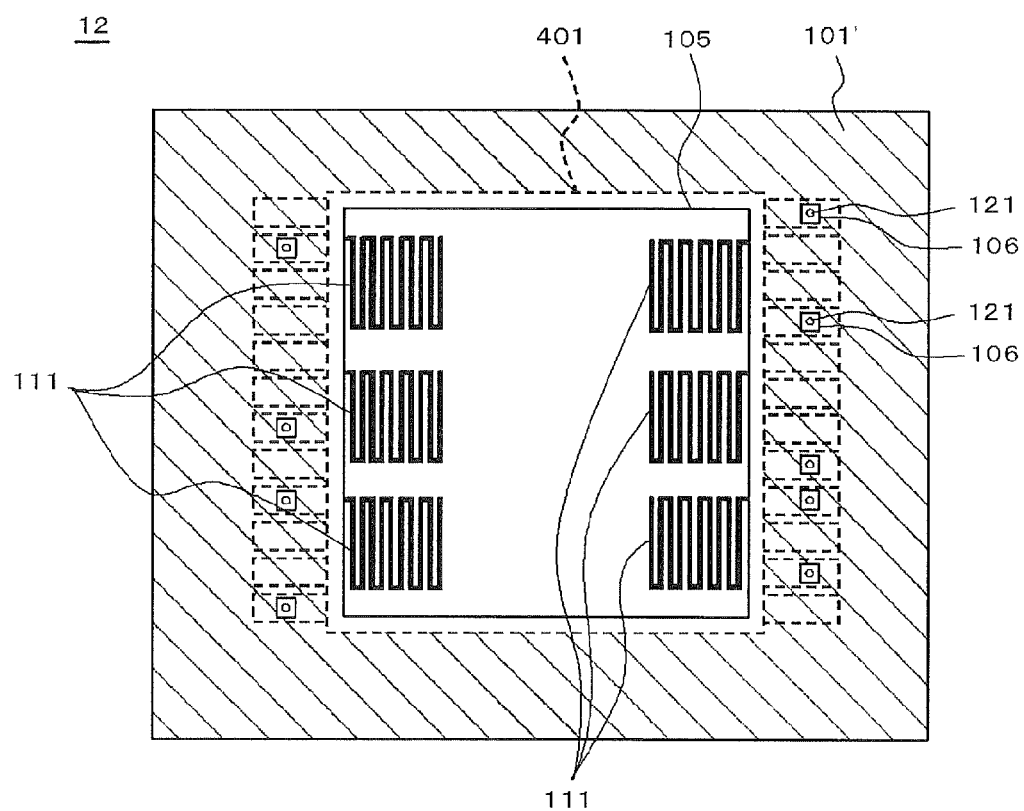
FIG. 22 is a top view illustrating an example of the interconnect substrate according to a fourth embodiment.
Figure 23:
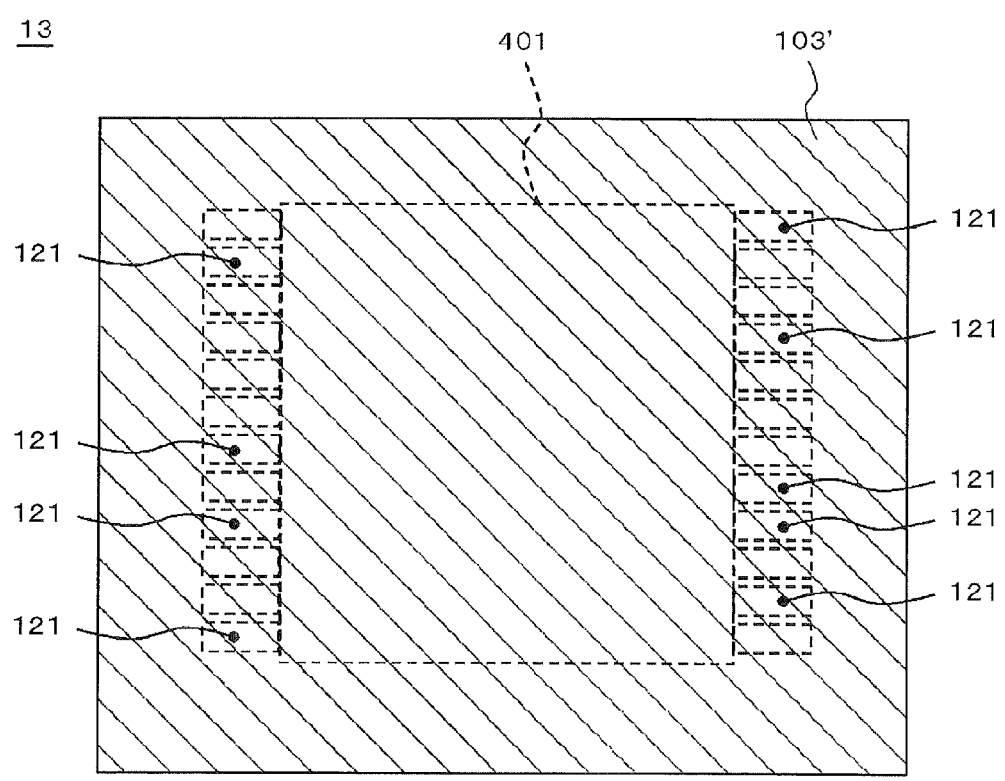
FIG. 23 is a top view illustrating an example of the interconnect substrate according to a fourth embodiment.
Figure 24:
FIG. 24 is a diagram illustrating an EBG structure in the related art.
Figure 24:
Figure 24:
Figure 24:
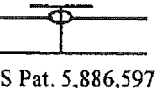
Figure 24:
Figure 24:

FIGS. 20 to 23 are top views illustrating an example of an interconnect substrate 200 according to a fourth embodiment of the invention. FIG. 20 is a top view illustrating a surface of the interconnect substrate 200 on which a digital circuit module 401 is mounted. In addition, FIGS. 21, 22, and 23 are top views in the A layer 11, the B layer 12, and the C layer 13 of the interconnect substrate 200, respectively. Meanwhile, the positional relationship between the A layer 11, the B layer 12 and the C layer 13 is the same as that of the first embodiment. In addition, the digital circuit module 401 is not present in the A layer 11, the B layer 12, and the C layer 13, but in order to show the positional relationship between each layer and the digital circuit module 401, the digital circuit module 401 is shown by the dotted lines in FIGS. 21, 22, and 23. The interconnect substrate 200 according to the embodiment is the same as the interconnect substrate 100 of the second embodiment, except for the following points.

The interconnect substrate 200 according to the embodiment is configured such that the digital circuit module 401 is mounted onto the surface thereof, and a plurality of ground terminals 210 of the digital circuit module 401 are connected to the conductor via 121 of the interconnect substrate 200.

As shown in FIGS. 21 and 23, the conductor via 121 is electrically connected to the first ground plane 102' of the A layer 11 and the second ground plane 103' of the C layer 13. As shown in FIG. 22, the conductor 121 passes through the second opening 106 provided in the first power plane 101' of the B layer 12 in a state of non-contact with the first power plane 101', and thus is electrically insulated from the first power plane 101'.

In the B layer 12, as shown in FIG. 22, the first opening 105 is provided at a position where at least a portion thereof overlaps the digital circuit module 401 when seen in a plan view. A plurality of interconnects 111 are disposed in the inside of the first opening 105. The interconnect 111 is formed opposite to the first ground plane 102' and the second ground plane 103', for example, with a dielectric interposed therebetween. One end of the interconnect 111 is connected to the first power plane 101' at the edge of the first opening 105, and the other end thereof is formed as an open end.

According to the embodiment, since the EBG structure can be formed using an empty region located at the lower part of the digital circuit module 401, it is possible to provide many EBG structures in a high-density interconnect substrate. In addition, since the EBG structure can be disposed in close proximity to the conductor via 121 which is a noise propagation path from the digital circuit module 401 to the interconnect substrate 200, it is possible to effectively suppress the propagation of noise.

The electronic element mounted to the interconnect substrate 200 is not necessarily limited to the digital circuit module 401, but may be any electronic element when an empty space is present immediately below the electronic element.

Meanwhile, the embodiment and a plurality of modified examples mentioned above can be naturally combined in the range consistent with the contents thereof. In addition, in the embodiments and modified examples mentioned above, although the function and the like of each component have been specifically described, it is possible to variously change the function and the like in the range that satisfies the invention.

The application claims priority from Japanese Patent Application No. 2010-217237 filed on Sep. 28, 2010, the content of which is incorporated herein by reference in its entirety.

The invention claimed is:

1. A structural body comprising:
   a first conductor and a second conductor of which at least portions are opposite to each other;
   a third conductor, interposed between the first conductor and the second conductor, of which at least a portion is opposite to the first conductor and the second conductor, and which has a first opening;
   an interconnect provided in an inside of the first opening; and
   a conductor via which is electrically connected to the first conductor and the second conductor and is electrically insulated from the third conductor,
   wherein the interconnect is opposite to the first conductor and the second conductor, one end thereof being electrically connected to the third conductor at an edge of the first opening and an other end thereof being formed as an open end.

2. The structural body according to claim 1, wherein at least one of the conductor vias is provided at a distance equal to or less than of ½ of a wavelength of a noise electromagnetic wave from a connection portion of the interconnect and the third conductor.

3. The structural body according to claim 1, wherein the interconnect forms a strip line using the first conductor and the second conductor as a return path.

4. The structural body according to claim 1, wherein a plurality of the interconnects are provided in the inside of the first opening.

5. The structural body according to claim 1, wherein the other end of the interconnect is branched.

6. The structural body according to claim 1, wherein the third conductor has a second opening, and
   the conductor via passes through an inside of the second opening in a state of non-contact with the third conductor.

7. The structural body according to claim 1, wherein the conductor via passes through the inside of the first opening in a state of non-contact with the third conductor and the interconnect.

8. The structural body according to claim 1, wherein the third conductor has a plurality of the first openings in which the interconnect is provided in the inside thereof.

9. An interconnect substrate comprising a laminated structure formed including an electric conductor and a dielectric,
   wherein the interconnect substrate includes at least one of the structural bodies according to claim 1 within the laminated structure.

10. The interconnect substrate according to claim 9, wherein the structural body is repeatedly arranged.

11. The interconnect substrate according to claim 9, further comprising at least one electronic element,
   wherein at least one of the first conductor, the second conductor and the third conductor is connected to a ground terminal or a power supply terminal of the at least one electronic element.

* * * * *